United States Patent [19]
Shimizu et al.

[11] Patent Number: 6,153,359
[45] Date of Patent: Nov. 28, 2000

[54] PROCESS FOR PRODUCING MULTILAYER PRINTED CIRCUIT BOARDS

[75] Inventors: Hiroshi Shimizu, Yuki; Nobuyuki Ogawa, Tsukuba; Katsuji Shibata, Shimotsuma; Akishi Nakaso, Oyama, all of Japan

[73] Assignee: Hitachi Chemical Company, Ltd., Tokyo, Japan

[21] Appl. No.: 09/275,874

[22] Filed: Mar. 25, 1999

Related U.S. Application Data

[63] Continuation-in-part of application No. 08/655,759, May 30, 1996, Pat. No. 5,945,258.

[30] Foreign Application Priority Data

Jun. 1, 1995 [JP] Japan ..................... 7-135087

[51] Int. Cl.$^7$ ............ H01L 21/306; C23C 3/002; B23F 1/018
[52] U.S. Cl. ............................. 430/314; 427/207
[58] Field of Search .......................... 427/307; 430/314

[56] References Cited

U.S. PATENT DOCUMENTS 5,945,258  8/1999  Shimizu et al. ................... 430/314

FOREIGN PATENT DOCUMENTS 2425221  12/1975  Germany.

Primary Examiner—John M. Ford
Assistant Examiner—Pavanaram K Sripada
Attorney, Agent, or Firm—Antonelli, Terry, Stout & Kraus, LLP

[57] ABSTRACT

An etching solution comprising (A) an amine as a solvent, (B) an alkali metal compound, and (C) an alcohol as a solvent, this etching solution being a non-aqueous solution. This etching solution is-effective for etching a cured epoxy resin layer for forming holes for interstitial via holes having a small diameter, in the production of a multilayer printed circuit board. This etching solution is particularly effective for etching a cured epoxy resin layer formed from a thermosetting epoxy resin composition including (a) an epoxy resin, (b) a crosslinking agent, and (c) a polyfunctional epoxy resin, which forms a thermosetting copper-clad adhesive resin sheet which covers an interlayer circuit plate of a multilayer printed circuit board.

11 Claims, 2 Drawing Sheets

PROCESS FOR PRODUCING MULTILAYER PRINTED CIRCUIT BOARDS

CROSS-REFERENCE TO RELATED APPLICATION

This application is a Continuation-In-Part application of Ser. No. 08/655,759, filed on May 30, 1996, now U.S. Pat. No. 5,945,258, the contents of which are incorporated by reference herein in their entirety.

BACKGROUND OF THE INVENTION

This invention relates to a process for producing a multilayer printed circuit board.

Multilayer printed circuit boards are produced by laminating a plurality of inner layer plates obtained by forming circuits on copper-clad laminates and a plurality of single-sided copper-clad laminates or copper foils via prepregs obtained by impregnating glass cloth as a base material with a resin, followed by pressing with heating to cure with heating, and forming circuits on outer surfaces of the integrated copper-clad laminates containing inner layer circuits therein.

With the recent tendency towards miniaturization, higher performance, and increased functions of electronic devices, multilayer printed circuit boards have become higher in density, thinner in individual layers, finer in wiring, smaller in the diameter for connecting individual layers, and have come to use interstitial via holes (hereinafter referred to as "IVHs") for connecting only neighboring wiring layers. Now, in order to make wiring density higher, a smaller diameter of IVH is required.

Figure 2A:
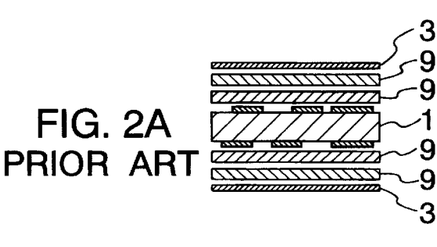
FIGS. 2A to 2I are schematic cross-sectional views explaining the steps of producing a multilayer printed circuit board according to prior art.
Figure 2B:
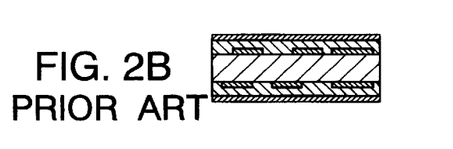
Figure 2C:
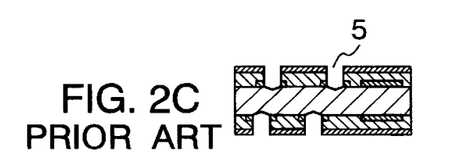
Figure 2D:
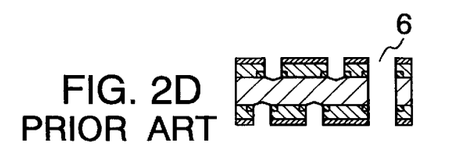
Figure 2E:
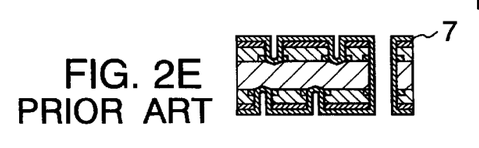
Figure 2F:
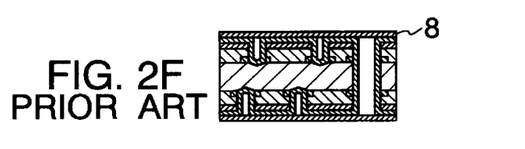
Figure 2G:
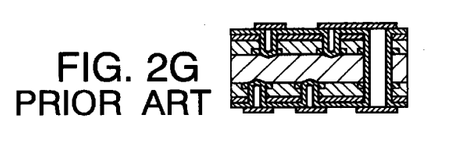
Figure 2H:
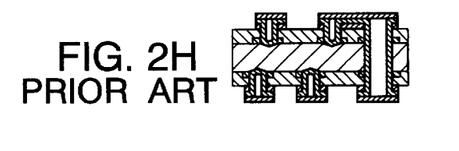
Figure 2I:
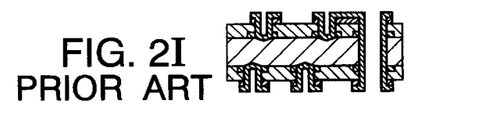

A prior art multilayer printed circuit board having IVHs is produced by laminating an inner layer circuit substrate 1 obtained by forming a circuit on a copper-clad laminate and a pair of single-sided copper-clad laminates or copper foils 3 via a plurality of prepregs 9 as shown in FIG. 2A, adhering under pressure, with heating, to give an integrated copper-clad laminate having interlayer circuits therein as shown in FIG. 2B, drilling holes on predetermined positions so as to reach the interlayer circuits to form holes 5 for IVH as shown in FIG. 2C, if necessary, drilling a through hole 6 according to a prior art process as shown in FIG. 2D, connecting the interlayer circuits and outer layer copper foils by electroless copper plating and electric copper plating 7 as shown in FIG. 2E, forming etching resists 8 on the outer layer copper foils as shown in FIG. 2F, conducting selective etchings as shown in FIGS. 2G and 2H, and removing the etching resists as shown in FIG. 2I.

According to prior art processes, polyimide films are used as a material capable of chemical etching using hydrazine, etc. as disclosed, for example, in JP-A 50-4577, JP-A 51-27464, JP-A 53-49068, etc. Further, processes for etching epoxy resin cured articles used for printed circuit boards using concentrated sulfuric acid, chromic acid, permanganic acid, etc. (surface roughness, smear treatment) are disclosed, for example, in JP-A 54-144968 and JP-A 62-104197.

According to the prior art processes for forming holes for IVH, since holes are drilled until interlayer circuits are reached, it is impossible to conduct the drilling by laminating a plurality of printed circuit boards, in contrast to drilling of through holes. Thus, the drilling is conducted one after another, requiring a long period of time and rendering poor productivity. Further, in order to control the depth of the point of the drill, the point of the drill coincides with the depth of the copper wiring patterns. Since there is a variation in thickness of multilayer printed circuit boards, in some cases the interlayer circuits are reached and in some cases they are not. In the case of a thin intralayer thickness, holes contact with a wiring circuit of the layer thereunder, result in a defective electrical connection. In addition, when holes of 0.3 mm or less in diameter are drilled, the life of drill is remarkably shortened due to loss of core center and from working of resin layers containing a glass cloth substrate.

On the other hand, according to prior art chemical etching methods, the use of hydrazine is not preferred due to its toxicity, and the use of concentrated sulfuric acid, chromic acid or permanganic acid is not preferred due to designation of special chemical substances. These chemical substances should be avoided from the viewpoint of safety.

SUMMARY OF THE INVENTION

It is an object of the present invention to provide a process for producing a multilayer printed circuit board containing interstitial via holes (IVHs) that are excellent in mass productivity, connection reliability and electrical properties, are capable of being made thin and show excellent safety during production.

The present invention provides a process for producing a multilayer printed circuit board, which comprises the step of:

laminating on an interlayer plate having conductor circuits thereon, a thermosetting copper-clad adhesive resin sheet having a copper foil on one side, so as to make the resin side of the sheet contact with the interlayer plate, followed by pressing with heating to cure the resin and to give an integrated laminate, said thermosetting copper-clad adhesive resin sheet having been prepared by integrating a copper foil with a thermosetting epoxy resin composition comprising (a) an epoxy polymer having a film-forming ability and a weight-average molecular weight of 100,000 or more, obtained by polymerizing a bifunctional epoxy resin and a bifunctional halogenated phenol in an equivalent weight ratio of epoxy group:phenolic hydroxyl group of 1:0.9 to 1:1.1, (b) a crosslinking agent, and (c) a polyfunctional epoxy resin, and curing the resin composition to become a B-stage condition, forming an etching resist on the copper foil of the thermosetting copper-clad adhesive resin sheet, followed by formation of fine holes in the copper foil surface by selective etching, removing the etching resist, removing the cured resin layer under the fine holes by etching using an etching solution comprising (A) an amide as a solvent, (B) an alkali metal compound, and (C) an alcohol as a solvent to form via holes and expose parts of the conductor circuits, plating a metal layer or coating an electroconductive paste so as to electrically connect the conductor circuits of the interlayer plate and an outer layer copper foil, forming an etching resist on the outer layer copper foil, followed by formation of wiring circuits on the copper foil by selective etching, and removing the etching resist.

DESCRIPTION OF THE PREFERRED EMBODIMENTS

In accordance with the present invention, studies of various resin compositions containing no glass cloth as a base material, capable of being thinned and suitable for forming holes for IVHs by chemical etching in one simple processing have been made. As a result, in accordance with the invention, a thermosetting epoxy resin composition has been found which can be subjected to chemical etching after thermal curing, and an etching solution therefor has also been discovered.

According to the present invention, a multilayer printed circuit board can be produced by laminating on an interlayer plate having conductor circuits thereon a thermosetting copper-clad adhesive resin sheets, each sheet having a copper foil on one side, so as to make the resin side of the sheet contact with the interlayer plate, followed by pressing with heating to cure the resin and to provide for an integrated laminate, said thermosetting copper-clad adhesive resin sheet having been prepared by integrating a copper foil with a thermosetting epoxy resin composition comprising (a) an epoxy polymer having a film-forming ability and a weight-average molecular weight of 100,000 or more, obtained by polymerizing a bifunctional epoxy resin and a bifunctional halogenated phenol in an equivalent weight ratio of epoxy group:phenolic hydroxyl group of 1:0.9 to 1:1.1, (b) a crosslinking agent, and (c) a polyfunctional epoxy resin, and curing the resin composition to become a B-stage condition, forming an etching resist on the copper foil of the thermosetting copper-clad adhesive resin sheet, followed by formation of fine holes in the copper foil surface by selective etching, removing the etching resist, removing the cured resin layer under the fine holes by etching using an etching solution comprising (A) an amide as a solvent, (B) an alkali metal compound, and (C) an alcohol as a solvent to form via holes and expose parts of the conductor circuits, plating a metal layer or coating an electroconductive paste so as to electrically connect the conductor circuits of the interlayer plate and an outer layer copper foil, forming an etching resist on the outer layer copper foil, followed by formation of wiring circuits on the copper foil by selective etching, and removing the etching resist.

The thermosetting epoxy resin composition used in the present invention comprises (a) an epoxy polymer having a film-forming ability, (b) a crosslinking agent, and (c) a polyfunctional epoxy resin.

The epoxy polymer (a) having a film-forming ability and a weight-average molecular weight of 100,000 or more, preferably 100,000 to 1,000,000, can be obtained by polymerizing a bifunctional epoxy resin and a bifunctional halogenated phenol in an equivalent weight ratio of epoxy group: phenolic hydroxyl group in the range of 1:0.9 to 1:1.1, in the presence of a catalyst, with heating, preferably in a solvent of an amide or ketone having a boiling point of 130° C. or higher, and in a reacted solid content of 50% by weight or less. The weight-average molecular weight is measured by gel permeation chromatography using polystyrene as a standard.

As the bifunctional epoxy resin, there can be used any compound having two epoxy groups in the molecule. Examples of the bifunctional epoxy resin are bisphenol A type epoxy resins, bisphenol F type epoxy resins, bisphenol S type resins, and aliphatic hairlike epoxy resins. The preferred resin is bisphenol A epoxy resin. These compounds may have any molecular weight. These compounds can be used singly or as a mixture thereof. Components other than the bifunctional epoxy resin may be contained as impurities so far as they do not affect the operation and accomplishment of the present invention.

As the bifunctional halogenated phenol, there can be used any compound having one or more halogen atoms as substituent and two phenolic hydroxyl groups. Examples of the bifunctional halogenated phenol are monocyclic bifunctional phenols such as hydroquinone, resorcinol, catechol, etc.; polycyclic bifunctional phenols such as bisphenol A, bisphenol F, naphthalene diols, bisphenols, and alkyl-substituted halides of these compounds. These compounds may have any molecular weight. These compounds can be used singly or as a mixture thereof. Components other than the bifunctional halogenated phenol may be contained as impurities so far as they do not affect the operation and accomplishment of the present invention.

As the catalyst, there can be used any compounds which have catalytic activity to accelerate the etherification reaction of epoxy group or groups with a phenolic hydroxy group or groups. Examples of the catalyst are alkali metal compounds, alkaline earth metal compounds, imidazoles, organic phosphorus compounds, secondary amines, tertiary amines, quaternary ammonium salts, etc. Among the catalysts, the use of alkali metal compounds is most preferable. Examples of the alkali metal compounds are hydroxides, halides, organic salts, alcoholates, phenolates, hydrides, borohydrides, and amides of sodium, lithium and potassium. These catalysts can be used singly or as a mixture thereof.

As the solvent used for the reaction, there can preferably be used amides or ketones, and amides having a boiling point of 130° C. or higher. Any solvents which can dissolve both the epoxy resins and phenols which are used as starting materials, can be used. Examples of the solvents are formamide, N-methyl formamide, N,N-dimethylformamide, acetamide, N-methylacetamide, N,N-dimethylacetamide, N,N,N',N'-tetramethylurea, 2-pyrrolidone, N-methyl-2-pyrrolidone, carbamic acid esters, etc. These solvents can be used singly or as a mixture thereof. As the ketones, there can be used cyclohexanone, acetyl acetone, diisobutyl ketone, phorone, isophorone, methyl cyclohexanone, acetophonone, etc.

As for the polymerization conditions, the mixing ratio of the bifunctional epoxy resin and the bifunctional halogenated phenol is in terms of the equivalent weight ratio of epoxy group:phenolic hydroxy group in the range of 1:0.9 to 1:1.1.

Although the quantity of the catalyst is not particularly limited, the catalyst, generally, is used in a quantity of 0.0001 to 0.2 mole per mole of the bifunctional epoxy resin.

The polymerization reaction temperature is preferably 600 to 150° C. When the temperature is lower than 60° C., there is a tendency to make the polymerization rate too slow. On the other hand, when the temperature is higher than 150° C., there is a tendency to bring about a side reaction and to fail to obtain a long chain polymer.

The solid content in the reaction solution during polymerization is preferably 50% by weight or less, more preferably 30% by weight or less.

As a result of the polymerization, the epoxy polymer (a) having a molecular weight of 100,000 or more is obtained.

As the crosslinking agent (b) for the epoxy polymer (a), there can be used masked isocyanates which are isocyanates masked (or blocked) with a compound having another active hydrogen.

The isocyanates can be any isocyanates having two or more isocyanate groups in the molecule. Examples of the masked isocyanates are isocyanate such as hexamethylene diisocyanate, diphenylmethane diisocyanate, isophorone diisocyanate, tolylene diisocyanate, etc. masked with a phenol, an oxime, an alcohol, etc. From the viewpoint of improvement in heat resistance of the cured article, the use of isophorone diisocyanate or tolylene diisocyanate masked with a phenol is preferred.

The amount of the crosslinking agent used is preferably 0.1 to 1.0 equivalent weight of the isocyanate group per equivalent weight of alcoholic hydroxyl group of the epoxy polymer (a).

As the polyfunctional epoxy resin (c), there can be used any compounds having two or more epoxy groups in the molecule. Examples of the polyfunctional epoxy resin (c) are glycidyl ethers of phenols such as phenol novolac epoxy resins, cresol novolac epoxy resins, resole epoxy resins, bisphenol epoxy resins etc.; alicyclic epoxy resins, epoxidized polybutadienes, glycidyl ester type epoxy resins, glycidylamine type epoxy resins, isocyanurate type epoxy resins, plexible epoxy resins, etc. Among them, a phenol type epoxy resin or a mixture of a phenol type epoxy resin and a polyfunctional epoxy resin is preferable, in order to improve heat resistance.

The polyfunctional epoxy resin (c) can be used in an amount of 20 to 100% by weight based on the weight of the epoxy polymer (a).

Further, since the polyfunctional epoxy resin (c) functions as an adhesive component and a flowing component at the time of molding, the amount used can be controlled properly, taking into account the thickness of copper foil on the interlayer, or the density of its circuits.

The polyfunctional epoxy resin (c) can be used singly or as a mixture thereof. Further, a curing agent and a curing accelerator for the polyfunctional I epoxy resin (c) can also be used. As the curing agent and the curing accelerator, there can be used a novolac type phenol resin, dicyandiamide, an acid anhydride, an amine, an imidazole, a phosphine, etc., singly or as a mixture thereof. Further, the addition of a silane coupling agent is preferable for improving adhesive strength of epoxy adhesive film, particularly for improving the adhesive strength to the copper foil.

Examples of the silane coupling agent are epoxysilane, aminosilane, ureasilane, etc.

A varnish comprising (a) the epoxy polymer, (b) the crosslinking agent, and (c) the polyfunctional epoxy resin, as mentioned above, is coated on the copper foil and dried with heating to give a copper-clad adhesive resin sheet of the B-stage. The preferable curing condition to get the B-stage condition is heating at 130–150° C. for 5–10 minutes. The thickness of the resin layer is preferably 25 to 70 $\mu$m, depending on the thickness of copper foil on the interlayer circuit. The thickness of copper foil is preferably 5 to 70 $\mu$m.

The thermosetting copper-clad adhesive resin sheet of B-stage is laminated on one or both sides of a previously prepared interlayer circuit plate so as to face the resin side of the adhesive resin sheet, followed by pressing with heating to cure with heating. Thus, a copper-clad laminate containing interlayer circuits is obtained. Since a B-stage thermosetting resin can be cured completely at a molding temperature of 170° C. or more for 30 minutes or more, there can be employed conventional molding conditions for epoxy resin laminates, so long as they satisfy the abovementioned conditions. Particularly, since the heating temperature and time influence the degree of curing and cause a variation in the etching speed at a later stage, it is necessary to cure completely. Further, since the pressure influences the flow of resins, it is necessary to employ a suitable pressure. A preferred pressure is 2 MPa or more.

Then, on one or both outer layer copper foils of the resulting copper-clad laminate containing interlayer circuits therein bonded with the thermosetting copper-clad adhesive resin sheet, an etching resist is formed, followed by development-selective etching by a conventional photography method to form fine holes on the copper foil sides. The conventional photography method is described in Chapter 6 of "Printed Circuits Handbook" (issued by McGraw-Hill Book Company, Editor-in-Chief: Cryde F. Coombs, Jr.). The fine holes become opening portions for IVH. Then, the etching resist is removed.

For Example, a dry film including a photosensitive resin layer (i.e. HK-425, HK-450, trade names, mfd. by Hitachi Chemical Co., Ltd.) is preferably used as the etching resist. In this case, the dry film is laminated on the copper foil using a hot-roll laminator. The conditions for exposing to light, developing and removing the film, depend on the type of the film.

The cured resin layer under the fine holes is removed by etching using an etching solution comprising (A) an amide series as a solvent, (B) an alkali metal compound, and (C) an alcohol series as a solvent so as to expose the interlayer circuit. The epoxy polymer (a) which is a component of the thermosetting resin composition constituting the thermosetting copper-clad adhesive resin sheet, can be dissolved by the alkali. The etching action of the cured resin layer is conducted by cutting and decomposition of the skeleton of the epoxy resin (a) having a high molecular weight by the alkali impregnated into the cured resin layer accompanying the amide series solvent and the alcohol series solvent so as to give fragments having a lower molecular weight, which are then dissolved in an amide series solvent to effect etching.

As the amide series solvent (A), there can be used formamide, N-methylformamide, N,N-dimethylformamide, acetamide, N-methylacetamide, N,N-dimethylacetamide, N,N,N',N'-tetramethylurea, 2-pyrrolidone, N-methyl-2-pyrrolidone, carbamic acid esters, etc. The use of N,N-dimethylacetamide, N,N-dimethylformamide, and N-methyl-2-pyrrolidone is preferable, since these solvents can remarkably dissolve decomposed portions of the cured product having a lower molecular weight. These solvents can be used singly or as a mixture thereof. Further, these solvents can be used together with one or more ketone series solvents, ether series solvents and other solvents.

Examples of the ketone series solvent used together are acetone, methyl ethyl ketone, 2-pentanone, 3-pentanone, 2-hexanone, methyl isobutyl ketone, 2heptanone, 4-heptanone, diisobutyl ketone, cyclohexanone, etc.

Examples of the other series solvent used together are dipropyl ether, diisopropyl ether, dibutyl ether, anisole, phenetole, dioxane, tetrahydrofuran, ethylene glycol dimethyl ether, ethylene glycol diethyl ether, diethylene glycol dimethyl ether, diethylene glycol diethyl ether, etc.

The contents of the solvents may not be particularly limited. It is preferable to contain the amide series solvent (A) in an amount of 50 to 90% by weight based on the total weight of the etching solution, in order to accelerate the decomposition rate and dissolving rate of the cured resin.

As the alkali metal compound (B), there can be used compounds of alkali metals such as lithium, sodium, potassium, rubidium, cecium, etc., said compounds being able to be dissolved in the alcohol solvent. Examples of the alkali metal compounds are metals such as lithium, sodium, potassium, rubidium, cecium, etc.; hydrides, hydroxides, borohydrides, amides, fluorides, chlorides, bromides, iodides, borates, phosphates, carbonates, sulfates, nitrates, organic acid salts and phenol salts of the alkali metals. These alkali metal compounds can be used singly or as a mixture thereof. Among these alkali metal compounds, the use of lithium hydroxide, sodium hydroxide and potassium hydroxide is particularly preferable from the perspective of the decomposition rate of the cured resin.

The alkali metal compound is preferably used in an amount of 0.5 to 15% by weight based on the total weight of the etching solution, in order to accelerate the decomposition rate of the cured resin.

As the alcohol series solvents (C), there can be used methanol, ethanol, 1-propanol, 2-propanol, 1butanol, 2-butanol, iso-butanol, tert-butanol, 1pentanol, 2-pentanol, 3-pentanol, 2-methyl-1-butanol, iso-pentyl alcohol, tert-pentyl alcohol, 3-methyl-2butanol, neopentyl alcohol, 1-hexanol, 2-methyl-1pentanol, 4-methyl-2-pentanol, 2-ethyl-1-butanol, 1heptanol, 2-heptanol, 3-heptanol, cyclohexanol, 1methylcyclohexanol, 2-methylcyclohexanol, 3methylcyclohexanol, 4-methylcyclohexanol, ethylene glycol, ethylene glycol monomethyl ether, ethylene glycol monoethyl ether, ethylene glycol monopropyl ether, ethylene glycol monobutyl ether, diethylene glycol, diethylene glycol monomethyl ether, diethylene glycol monoethyl ether, diethylene glycol monopropyl ether, diethylene glycol monobutyl ether, triethylene glycol, triethylene glycol monomethyl ether, triethylene glycol monoethyl ether, tetraethylene glycol, polyethylene glycol, 1,2-propanediol, 1,3-propanediol, 1,2-butanediol, 1,3-butanediol, 1,4-butanediol, 2,3butanediol, 1,5-pentanediol, glycerin, diproylene glycol, etc., singly or as a mixture thereof.

Among these alcohols, the use of methanol, ethanol, diethylene glycol monomethyl ether, diethylene glycol monobutyl ether, diethylene glycol monoethyl ether, ethylene glycol monomethyl ether, ethylene glycol monobutyl ether, and ethylene glycol monoethyl ether singly or as a mixture thereof is particularly preferable, due to high solubility of the alkali metal compound.

It is preferable to use the alcohol (c) in an amount of 4.5 to 35% by weight based on the total weight of the etching solution in order to accelerate the decomposition rate of the cured resin.

Since the contact time of the cured resin and the etching solution, and the temperature of the etching solution depend mutually on the desirable etching speed and degree of etching, it is necessary to employ conditions suitable for the IVH diameter and IVH thickness. Generally, the diameter is 50 $\mu$m to 1mm. In this case, the preferable contact time is 10 to 60 minutes and the preferable temperature of the etching solution is 50 to 80° C. Any etching method such as a spray method, or a dip method, can be employed so long as the etching solution as mentioned above is used. In other words, it is possible to form a fine IVH if the combination of the thermosetting epoxy resin composition as a cured resin layer and the etching solution is used and the suitable conditions are employed.

For the removal of decomposed material sufficiently, it is preferable to wash holes with water using an ultrasonic washing device. The preferred time for the washing is 3 to 5 minutes.

After the etching, the exposed interlayer circuits and the outer layer copper foils are electrically connected by a conventional plating method, such as an electric plating. When the size of IVH is small, electroless plating can be used.

Further, the electrical connection can be carried out using an electroconductive paste, which is coated, dried and cured.

Then, an etching resist is formed on the outer layer copper foil and development/selective etching is conducted by a conventional photography method to form wiring circuits on the outer layer copper foil side. After removing the etching resist, there can be obtained a multilayer printed circuit board wherein the interlayer circuits and outer layer circuits are connected by IVHs.

Using the thus produced multilayer printed circuit board as an inner layer, laminating one or a pair of thermosetting copper-clad adhesive resin sheets on the inner layer, and repeating this a number of times, it is possible to obtain a multilayer printed circuit board having 6 or more layers connected by IVHs.

The present invention is illustrated by way of the following Examples, in which all parts and percents are by weight unless otherwise specified.

(Epoxy Resin)

As the cured epoxy resin to be etched, there can be used any cured epoxy resins so long as they contain one or more halogen atoms such as chlorine, bromine or the like therein in an amount of 5% by weight or more and preferably 80% by weight or less.

Components of the cured epoxy resin containing one or more halogen atoms include an epoxy resin or high-molecular weight epoxy polymer, and a curing agent or a cross-linking agent. The halogen atoms can be included in either one or both components. If necessary, one or more curing accelerators, catalysts, elastomers, fillers, and fire retardants may be included therein.

As the epoxy resin, there can be used any ones which contain one or more epoxy groups in the molecule. Examples of such epoxy resins are bisphenol A epoxy resins, bisphenol F epoxy resins, bisphenol S epoxy resins, alicyclic epoxy resins, aliphatic linear epoxy resins, phenol novolak epoxy resins, cresol novolak epoxy resins, bisphenol A novolak epoxy resins, diglycidylethers of phenols, diglycidyl ethers of alcohols, alkyl-substituted epoxy resins thereof, halogenated epoxy resins thereof, halogenated epoxy resins containing at least one of halogenated polyfunctional epoxy resins and halogenated polyfunctional phenols, halogenated high molecular weight epoxy polymer having a weight average molecular weight of 50,000 or more and preferably 200,000 or less, and may be obtained from at least one of a halogenated bifunctional epoxy resin and a halogenated bifunctional phenol, etc., hydrogenated epoxy resins thereof, etc. These epoxy resins can be used alone or as a mixture thereof, or can include components other than epoxy resins as an impurity.

(Curing agent)

As the curing agent for the epoxy resin, there can be used any ones which can cure the epoxy resins. For example, there can be used polyfunctional phenols, amines, imidazoles, acid anhydrides, organic phosphorus compounds, and halogenated compounds thereof.

As the polyfunctional phenols, there can be used single ring bifunctional phenols such as hydroquinone, resorcinol, catechol, etc.; multi ring bifunctional phenols such as bisphenol A, bisphenol F, naphthalene diols, biphenols, halogenated compounds thereof and alkyl-substituted compounds thereof. It is also possible to use polycondensates of these phenols and an aldehyde such as novolaks, resols, etc.

As the amines, there can be used aliphatic or aromatic primary amines, aliphatic and aromatic secondary amines, aliphatic and aromatic tertiary amines, quaternary ammonium salts, aliphatic cyclic amines, guanidines, urea derivatives, etc.

Examples of these compounds are N,N-benzyldimethylamine, 2-(dimethylaminomethyl) phenol, 2,4,6-tris(dimethylaminomethyl) phenol, tetramethylguanidine, triethanolamine, N,N'-dimethylpiperazine, 1,4-diazabicyclo[2,2,2]octane, 1,8-diazabicyclo[5,4,0]-7-undecene, 1,5-diazabicylo[4,4,0]-5-nonene, hexamethylenetetramine, pyridine, picoline, piperidine, pyrrolidine, dimethylcyclohexylamine, dimethylhexylamine, cyclohexylamine, diisobutylamine, di-n-butylamine, diphenylamine, N-methylaniline, tri-n-propylamine, tri-n-octylamine, tri-n-butylamine, triphenylamine, tetramethylammonium chloride, tetramethylammonium bromide, tetramethyl ammonium iodide, triethylenetetramine, diaminodiphenylmethane, diaminodiphenyl ether, dicyandiamide, tolylbiguanide, guanyl urea, dimethyl urea, etc.

Examples of the imidazoles are imidazole, 2-ethylimidazole, 2-ethyl-4-methylimidazole, 2-methylimidazole, 2-phenylimidazole, 2-undecylimidazole, 1-benzyl-2-methylimidazole, 2-heptadecylimidazole, 4,5-diphenylimidazole, 2-methylimidazoline, 2-phenylimidazoline, 2-undecylimidazoline, 2-heptadecylimidazoline, 2-isopropylimidazoline, 2,4-dimethylimidazole, 2-phenyl-4-methylimidazole, 2-ethylimidazoline, 2-phenyl-4-methylimidazoline, benzimidazole, 1-cyanoethylimidazole, etc.

Examples of the acid anhydrides are phthalic anhydride, hexahydrophthalic anhydride, pyromellitic dianhydride, benzophenonetetracarboxylic dianhydride, etc.

As the organic phosphorus compounds, there can be used any phosphorus compounds having an organic group. Examples of the organic phosphorus compounds are hexamethylphosphoric triamide, tri(dichloropropyl) phosphate, tri(chloropropyl) phosphate, triphenyl phosphate, trimethyl phosphate, phenylphosphonic acid, tri-n-butylphosphine, diphenylphosphine, etc.

These curing agents can be used alone or as a mixture thereof.

The amount of these curing agent for halogenated epoxy resins is not particularly limited so long as they can urge forward the curing reaction. Preferable amount of the curing agent is 0.01 to 5.0 equivalent weight per mole of the epoxy group.

(Curing accelerator)

The thermosetting epoxy resin composition of the present invention can include a curing accelerator, if necessary. Typical curing accelerators are tertianyl amines, imidazoles, quaternary ammonium salts, etc.

EXAMPLE 1

Production of a multilayer printed circuit board is explained referring to FIGS. 1A to 1M.

A bisphenol A type epoxy resin (epoxy equivalent weight: 171.5) as a bifunctional epoxy resin in an amount of 171.5 g, 271.9 g of a tetrabromobisphenol A (hydroxyl equivalent weight: 271.9) as a bifunctional halogenated phenol, and 0.78 g of lithium hydroxide as a catalyst were dissolved in N,N'-dimethylacetamide, as an amide series solvent. The solid content in the solution was 30% by weight. The solution was stirred by a mechanical stirrer and maintained at 120° C. for 10 hours. Finally, the solution was saturated at 5,000 mPa sec viscosity and an epoxy polymer having a high molecular weight was obtained. The weight-average molecular weight of the epoxy polymer was 182,000 (gel permeation chromatography).

Figure 1A:
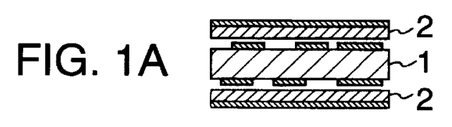
FIGS. 1A to 1M are schematic cross-sectional views explaining the steps of producing the multilayer printed circuit board according to one example of the present invention.
Figure 1B:
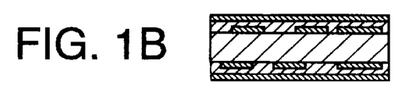

A resin composition comprising the epoxy polymer having a high molecular weight (a), an isophorone diisocyanate masked with a phenol resin (b), and a cresol novolac polyfunctional epoxy resin (c) (the weight ratio of (a):(b):(c)=100:16:84) was coated on a roughened copper foil (18 μm thick) to give a thermosetting copper-clad adhesive resin sheet 2 having a resin layer (B-stage condition cured by heating at 130° C. for 10 minutes) of 50 μm thick (MCF-3000E, a trade name, mfd. by Hitachi Chemical Co., Ltd.), which was laminated on a previously prepared interlayer circuit plate 1 (substrate: MCI-E-67, a trade name, mfd. by Hitachi Chemical Co., Ltd., shown in FIG. 1A). Then, pressing in a vacuum was conducted at 170° C. under a pressure of 2 MPa for 30 minutes to give a copper-clad laminate containing interlayer circuits (FIG. 1B).

Figure 1C:
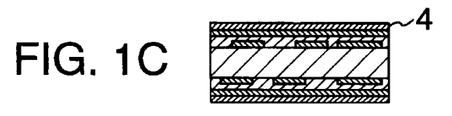
Figure 1D:
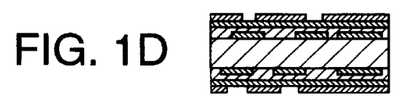
Figure 1E:
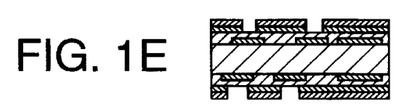

An etching resist 4 (a photosensitive dry film, H-K 450, a trade name, mfd. by Hitachi Chemical Co., Ltd.) was formed on each surface of outer layer copper foil of the copper-clad laminate containing interlayer circuits using a hot-roll laminator (FIG. 1C). A part of the resist with diameters of 50 to 300 μm were removed from selected positions by a photography method, to form holes for IVH (FIG. 1D). The conditions for removal were exposure to 50 mJ/cm$^2$ strength light and development with a Na$_2$CO$_3$ aqueous solution. Further, from the portions in which IVHs are to be formed, a part of the outer layer copper foil was removed (FIG. 1E).

Figure 1F:
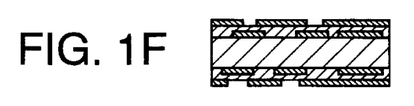

Then, the etching resists were removed by NaOH aqueous solution to expose cured epoxy adhesive film on the portions in which IVHs are to be formed (FIG. 1F).

Figure 1G:
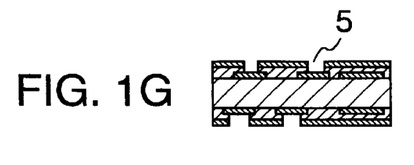

Subsequently, an etching solution comprising 90% of N-methyl-2-pyrrolidone, 3% of potassium hydroxide and 7% of methanol heated at 50° C. was contacted to etch the cured epoxy adhesive film for 15 minutes, so as to expose the interlayer circuits (a dip method). Thus, holes for IVHs were formed. Since the removal of decomposed materials was insufficient, the holes were subjected to continuous ultrasonic treatment by dipping the board into an ultrasonic washing device for 3 minutes and washing with water (FIG. 1G).

Figure 1H:
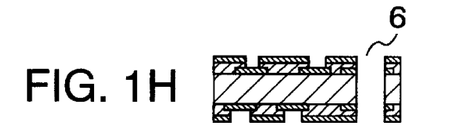

Then, a through hole 6 was drilled (FIG. 1H).

Figure 1I:
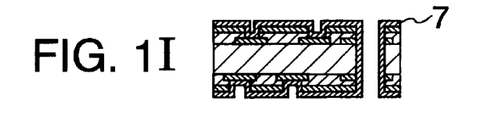
Figure 1J:
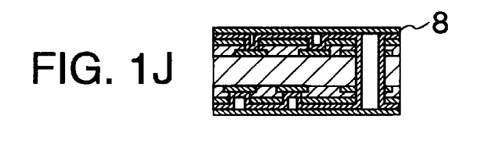

Subsequently, copper plating of 15 to 20 μm was conducted in the holes for IVH and the through hole, so as to electrically connect the interlayer circuits and the outer layer copper foils (FIG. 1I).

Figure 1K:
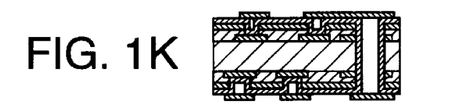
Figure 1L:
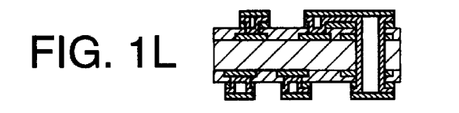
Figure 1M:
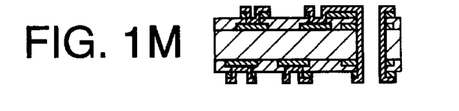

Next, an etching resist 8 (a photosensitive dry film, H-K 425, a trade name, mfd. by Hitachi Chemical Co., Ltd.) was formed on each outer layer surface using a hot-roll laminator (FIG. 1J), and subjected to selective etching to form wiring circuits (FIGS. 1K and 1L). After removal of the etching resists (FIG. 1M), there was obtained a four-layered multilayer printed circuit board.

The resulting multilayer printed circuit board was subjected to an anti-corrosion test, a soldering heat resistance test and a test to measure the peel strength of the surface copper foil.

The anti-corrosion test was conducted by subjecting the interlayer circuit previously having a comb-like pattern with a conductor interval of 0.1 mm to the conditions of 120° C., 85% of moisture and 100V to measure changes of an insulation resistance. The initial value was $10^{13}$ Ω and changed to $10^{12}$ Ω after 1000 hours. As to the soldering heat resistance test, no change was admitted after the solder float test at 260° C. for 3 minutes. The peel strength of surface copper foil was 1.7 kg/cm.

EXAMPLE 2

The process of Example 1 was repeated except for the use of an etching solution comprising 50% of N-methyl-2-pyrrolidone, 15% of potassium hydroxide and 35% of methanol heated at 70° C., and conducting etching by contacting with the cured epoxy adhesive film for 30 minutes. As a result, a 4-layered multilayer printed circuit board having the same properties as in Example 1 was obtained.

EXAMPLE 3

The process of Example 1 was repeated except for the use of an etching solution comprising 90% of N,N-dimethylacetamide, 1% of potassium hydroxide and 9% of diethylene glycol monomethyl ether heated at 70° C., and conducting etching by contacting with the cured epoxy adhesive film for 15 minutes. As a result, a 4-layered multilayer printed circuit board having the same properties as in Example 1 was obtained.

EXAMPLE 4

The process of Example 1 was repeated except for the use of an etching solution comprising 80% of N,N-dimethylformamide, 4% of sodium hydroxide and 16% of methanol heated at 50° C., and conducting etching by contacting with the cured epoxy adhesive film for 15 minutes. As a result, a 4-layered multilayer printed circuit board having the same properties as in Example 1 was obtained.

EXAMPLE 5

The process of Example 1 was repeated except for the use of an etching solution comprising 80% of N,N-dimethylformamide, 0.5% of lithium hydroxide and 19.5% of methanol heated at 60° C., and conducting etching by contacting with the cured epoxy adhesive film for 25 minutes. As a result, a 4-layered multilayer printed circuit board having the same properties as in Example 1 was obtained.

COMPARATIVE EXAMPLE 1

The process of Example 1 was repeated except for the use of an etching solution containing N,N-dimethylacetamide heated at 50° C. As a result, the cured epoxy adhesive film was not etched and failed to obtain the holes for IVH.

COMPARATIVE EXAMPLE 2

The process of Example 1 was repeated except for the use of an etching solution containing methanol heated at 50° C. As a result, the cured epoxy adhesive film was not etched and failed to obtain the holes for IVH.

COMPARATIVE EXAMPLE 3

The process of Example. 1 was repeated except for the use of an etching solution of an aqueous solution containing 5% of sodium hydroxide and 5% of potassium permanganate heated at 70° C. As a result, the cured epoxy adhesive film was roughened on the surface and failed to expose the interlayer circuits and also failed to form holes for IVH.

EXAMPLE 6

To 100 parts by weight of brominated bisphenol A epoxy resin having a bromine content of 22% by weight and an epoxy equivalent of 470, 4 parts by weight of dicyandiamide, and 0.5 part by weight of imidazole were added to give an epoxy resin composition in methyl ethyl ketone solution. The resin solution was coated on a roughened surface of copper foil, followed by drying at 150° C. for 5 minutes using a dryer to remove the solvent and to give an epoxy adhesive film of 50 μm thickness having a copper foil. The resulting adhesive film was laminated on one side of a copper-clad laminate at 170° C. for 30 minutes.

The outer copper foil on the adhesive side of the resulting 3-layered laminate was subjected to etching to remove unnecessary portions, followed by drilling a hole of 0.15 mm in diameter to expose the cured article of the epoxy adhesive film. The obtained article was a test sample for evaluating etching properties.

As an etching solution, a mixed solution of 4% by weight of sodium hydroxide, 80% by weight of N-methyl-2-pyrrolidone and 16% by weight of methanol was prepared. The test sample was dipped in the etching solution for 60 minutes.

EXAMPLE 7

The process of Example 6 was repeated to evaluate the etching properties, except an epoxy resin composition comprising 100 parts by weight of a brominated bisphenol A epoxy resin having a bromine content of 48% and an epoxy equivalent of 400, 30 parts by weight of a phenol novolak resin, and 0.2 part by weight of imidazole was used.

EXAMPLE 8

The process of Example 6 was repeated to evaluate etching properties, except a resin composition comprising 100 parts by weight of a high molecular weight epoxy polymer having a weight average molecular weight of 100,000 synthesized by using bisphenol A epoxy resin and bisphenol A, 20 parts by weight of phenol-masked diisocyanate, and 30 parts by weight of tetrabromobisphenol A epoxy resin was used.

EXAMPLE 9

The process of Example 6 was repeated to evaluate etching properties, except a resin composition comprising 100 parts by weight of a high molecular weight epoxy polymer having a weight average molecular weight of 130,000 synthesized by using bisphenol A epoxy resin and tetrabromobisphenol A, 20 parts by weight of diisocyanate masked with methyl ethyl ketone oxime, 30 parts by weight of bisphenol A epoxy resin and 20 parts by weight of talc as a filler was used.

EXAMPLE 10

The process of Example 6 was repeated for evaluating etching properties except for using as an etching solution a mixed solution comprising 5 parts by weight of lithium hydroxide, 75 parts by weight N,N-dimethylacetamide, and 20 parts by weight of polyethylene glycol having an average molecular weight of 400 (average repeating units number of 11).

EXAMPLE 11

The process of Example 6 was repeated for evaluating etching properties except for using as an etching solution a mixed solution comprising 5 parts by weight of sodium hydroxide, 70 parts by weight of N-methylpyrrolidone, and 25 parts by weight of polyethylene glycol having an average molecular weight of 300 (average repeating units number of 9).

EXAMPLE 12

The process of Example 6 was repeated for evaluating etching properties except for using as an etching solution a mixed solution comprising 5 parts by weight of sodium hydroxide, 75 parts by weight of N,N-dimethylformamide and 20 parts by weight of polyethylene glycol having an average molecular weight of 200 (average repeating units number of 6).

(Test Method)

Etching properties were evaluated as follows.

Each test sample was dipped in an etching solution at a predetermined temperature for one hour. Then the hole having a diameter of 0.15 mm of the test sample was observed by a microscope to measure a diameter of exposed inner layer copper foil obtained by etching of the adhesive film cured article.

This test was conducted immediately after the preparation of the etching solution, after 3 days, after 5 days and after 10 days to measure the exposed diameters of inner layer copper foils, and precipitation after 3 and 10 days for evaluating the etching solutions. When an exposed diameter of the inner layer copper foil is too large, connection between a outer and inner layer copper foils becomes difficult. Therefore, the exposed diameter of inner layer copper foil is preferably 0.05 mm. As to the precipitated amount, the smaller the better.

The results are shown in Table 1 below.

TABLE 1

| Example No. | 6 | 7 | 8 | 9 | 10 | 11 | 12 |
|---|---|---|---|---|---|---|---|
| Temp. (° C.) | 50 | 50 | 50 | 50 | 50 | 50 | 50 |
| Inner layer copper foil diameter (mm) | | | | | | | |
| Immediately after | 0.14 | 0.15 | 0.14 | 0.15 | 0.14 | 0.14 | 0.13 |
| After 3 days | 0.12 | 0.12 | 0.13 | 0.13 | 0.13 | 0.12 | 0.12 |
| After 5 days | 0.10 | 0.11 | 0.12 | 0.13 | 0.13 | 0.11 | 0.10 |
| After 10 days | 0.08 | 0.10 | 0.11 | 0.12 | 0.12 | 0.10 | 0.09 |
| Precipitation | | | | | | | |
| After 3 days | No | No | No | No | No | No | No |
| After 10 days | Slt | Slt | Slt | Slt | Slt | Slt | Slt |

(Note) Slt = Slight

As mentioned above, according to the present invention, since the formation of IVH can be attained simultaneously by chemical etching and small holes of 100 μm in diameter or less can be processed, productivity is greatly improved compared with the drill processing of prior art technique and processing of very fine diameters becomes possible in contrast to drilling, which is difficult to conduct. Further, since a thermosetting copper-clad adhesive resin sheet is used, the pressing step can be simplified to improve productivity compared with the prior art technique using prepregs. The resin composition used for the thermosetting copper-clad adhesive resin sheet has the same general properties as FR-4 which is used in multilayer printed circuit boards. Therefore, the present invention is remarkably useful in the production of multilayer printed circuit boards mounting various electronic devices in high density.

Furthermore, the present invention is excellent in safety during the process.

What is claimed is:

1. An etching solution for etching cured epoxy resin, said etching solution comprising:

(A) an amide as a solvent, said amide being at least one member selected from the group consisting of formamide, N-methylformamide, N,N-dimethylformamide, acetamide, N-methylacetamide, N,N-dimethylacetamide, N,N,N',N'-tetramethylurea, 2-pyrrolidone, N-methyl-2-pyrrolidone, and carbamic acid esters, (B) an alkali metal compound, said alkali metal compound being at least one member selected from the group consisting of hydrides, hydroxides, borohydrides, amides, fluorides, chlorides, bromides, iodides, borates, phosphates, carbonates, sulfates, nitrates, organic acid salts and phenol salts of lithium, sodium, potassium, rubidium and cesium, and (C) an alcohol as a solvent, said alcohol being selected from the group consisting of:
   methanol, ethanol, 1-propanol, 2-propanol, 1-butanol, 2-butanol, iso-butanol, tert-butanol, 1-pentanol, 2-pentanol, 3-pentanol, 2-methyl-1-butanol, isopentyl alcohol, tert-pentyl alcohol, 3-methyl-2-butanol, neopentyl alcohol, 1-hexanol, 2-methyl-1-pentanol, 4-methyl-2-pentanol, 2-ethyl-1-butanol, 1-heptanol, 2-heptanol, 3-heptanol, cyclohexanol, 1-methylcyclohexanol, 2-methylcyclohexanol, 3-methylcyclohexanol, 4-methylcyclohexanol, ethylene glycol, ethylene glycol monomethyl ether, ethylene glycol monoethyl ether, ethylene glycol monopropyl ether, ethylene glycol monobutyl ether, diethylene glycol, diethylene glycol monomethyl ether, diethylene glycol monoethyl ether, diethylene glycol monopropyl ether, diethylene glycol monobutyl ether, triethylene glycol, triethylene glycol monomethyl ether, triethylene glycol monoethyl ether, tetraethylene glycol, polyethylene glycol, 1,2-propanediol, 1,3-propanediol, 1,2-butanediol, 1,3-butanediol, 1,4-butanediol, 2,3-butanediol, 1,5-pentanediol, glycerin, and dipropylene glycol,
   wherein said etching solution is a non-aqueous solution.

2. The etching solution according to claim 1, wherein the cured epoxy resin is obtained from a composition comprising:

(a) an epoxy polymer having a film-forming ability and a molecular weight of 100,000 or more, obtained by polymerizing a bifunctional epoxy resin and a bifunctional halogenated phenol in an equivalent weight ratio of epoxy group/phenolic hydroxyl group of 1:0.9 to 1:1.1 in the presence of a catalyst with heating, (b) a crosslinking agent for the epoxy polymer (a), and (c) a polyfunctional epoxy resin.

3. The etching solution according to claim 1, wherein the amide (A) is used in an amount of 50 to 95% by weight, the alkali metal compound (B) is used in an amount of 0.5 to 15% by weight and the alcohol (C) is used in an amount of 4.5 to 35% by weight based on the weight of the etching solution.

4. The etching solution according to claim 1, wherein the cured epoxy resin is a cured epoxy resin containing halogen atoms.

5. The etching solution according to claim 4, wherein the cured epoxy resin contains 5% by weight or more of halogen atoms.

6. The etching solution according to claim 4, wherein the cured epoxy resin containing halogen atoms contains at least one of a halogenated polyfunctional epoxy resin and a halogenated polyfunctional phenol.

7. The etching solution according to claim 4, wherein the cured epoxy resin containing halogen atoms is a cured high molecular weight epoxy polymer having halogen atoms and a weight average molecular weight of 50,000 or more.

8. The etching solution according to claim 7, wherein the cured high molecular weight epoxy polymer is obtained from at least one of a halogenated bifunctional epoxy resin and a halogenated bifunctional phenol.

9. The etching solution according to claim 4, wherein the halogen atom of the cured epoxy resin is bromine atoms.

10. An etching solution for etching cured epoxy resin, said etching solution consisting essentially of:
   (A) an amide as a solvent, said amide being at least one member selected from the group consisting of formamide, N-methylformamide, N,N-dimethylformamide, acetamide, N-methylacetamide, N,N-dimethylacetamide, N,N,N',N'-tetramethylurea, 2-pyrrolidone, N-methyl-2-pyrrolidone, and carbamic acid esters,
   (B) an alkali metal compound, said alkali metal compound being at least one member selected from the group consisting of hydrides, hydroxides, borohydrides, amides, fluorides, chlorides, bromides, iodides, borates, phosphates, carbonates, sulfates, nitrates, organic acid salts and phenol salts of lithium, sodium, potassium, rubidium and cesium, and
   (C) an alcohol as a solvent, said alcohol being selected from the group consisting of:
      methanol, ethanol, 1-propanol, 2-propanol, 1-butanol, 2-butanol, iso-butanol, tert-butanol, 1-pentanol, 2-pentanol, 3-pentanol, 2-methyl-1-butanol, iso-pentyl alcohol, tert-pentyl alcohol, 3-methyl-2-butanol, neopentyl alcohol, 1-hexanol, 2-methyl-1-pentanol, 4-methyl-2-pentanol, 2-ethyl-1-butanol, 1-heptanol, 2-heptanol, 3-heptanol, cyclohexanol, 1-methylcyclohexanol, 2-methylcyclohexanol, 3-methylcyclohexanol, 4-methylcyclohexanol, ethylene glycol, ethylene glycol monomethyl ether, ethylene glycol monoethyl ether, ethylene glycol monopropyl ether, ethylene glycol monobutyl ether, diethylene glycol, diethylene glycol monomethyl ether, diethylene glycol monoethyl ether, diethylene glycol monopropyl ether, diethylene glycol monobutyl ether, triethylene glycol, triethylene glycol monomethyl ether, triethylene glycol monoethyl ether, tetraethylene glycol, polyethylene glycol, 1,2-propanediol, 1,3-propanediol, 1,2-butanediol, 1,3-butanediol, 1,4-butanediol, 2,3-butanediol, 1,5-pentanediol, glycerin, and dipropylene glycol.

11. An etching solution for etching cured epoxy resin, said etching solution consisting of:
   (A) an amide as a solvent, said amide being at least one member selected from the group consisting of formamide, N-methylformamide, N,N-dimethylformamide, acetamide, N-methylacetamide, N,N-dimethylacetamide, N,N,N',N'-tetramethylurea, 2-pyrrolidone, N-methyl-2-pyrrolidone, and carbamic acid esters,
   (B) an alkali metal compound, said alkali metal compound being at least one member selected from the group consisting of hydrides, hydroxides, borohydrides, amides, fluorides, chlorides, bromides, iodides, borates, phosphates, carbonates, sulfates, nitrates, organic acid salts and phenol salts of lithium, sodium, potassium, rubidium and cesium, and
   (C) an alcohol as a solvent, said alcohol being selected from the group consisting of:
      methanol, ethanol, 1-propanol, 2-propanol, 1-butanol, 2-butanol, iso-butanol, tert-butanol, 1-pentanol, 2-pentanol, 3-pentanol, 2-methyl-1-butanol, iso-pentyl alcohol, tert-pentyl alcohol, 3-methyl-2-butanol, neopentyl alcohol, 1-hexanol, 2-methyl-1-pentanol, 4-methyl-2-pentanol, 2-ethyl-1-butanol, 1-heptanol, 2-heptanol, 3-heptanol, cyclohexanol, 1-methylcyclohexanol, 2-methylcyclohexanol, 3-methylcyclohexanol, 4-methylcyclohexanol, ethylene glycol, ethylene glycol monomethyl ether, ethylene glycol monoethyl ether, ethylene glycol monopropyl ether, ethylene glycol monobutyl ether, diethylene glycol, diethylene glycol monomethyl ether, diethylene glycol monoethyl ether, diethylene glycol monopropyl ether, diethylene glycol monobutyl ether, triethylene glycol, triethylene glycol monomethyl ether, triethylene glycol monoethyl ether, tetraethylene glycol, polyethylene glycol, 1,2-propanediol, 1,3-propanediol, 1,2-butanediol, 1,3-butanediol, 1,4-butanediol, 2,3-butanediol, 1,5-pentanediol, glycerin, and dipropylene glycol.

* * * * *